(12) United States Patent
Dudler et al.

(10) Patent No.: US 6,754,610 B2
(45) Date of Patent: Jun. 22, 2004

(54) DIGITAL SIGNAL PROCESSING OF RESOLVER ROTOR ANGLE SIGNALS

(75) Inventors: Donald R. Dudler, Tucson, AZ (US); C. Mike Warner, Aura (CL)

(73) Assignee: Raytheon Company, Walthma, MA (US)

( * ) Notice: Subject to any disclaimer, the term of this patent is extended or adjusted under 35 U.S.C. 154(b) by 318 days.

(21) Appl. No.: 09/859,347

(22) Filed: May 16, 2001

(65) Prior Publication Data
US 2002/0173931 A1 Nov. 21, 2002

(51) Int. Cl.$^7$ .......................... G01C 19/00; G01C 9/00; G01C 17/00
(52) U.S. Cl. ...................................... 702/151
(58) Field of Search ................... 702/151, 127, 702/150; 73/660; 341/116, 112, 114; 318/661

(56) References Cited

U.S. PATENT DOCUMENTS

| | | | | |
|---|---|---|---|---|
| 4,334,179 A | * | 6/1982 | Grimes et al. ............... | 318/661 |
| 4,594,540 A | * | 6/1986 | Currie et al. ................ | 318/661 |
| 4,710,770 A | * | 12/1987 | Hakata et al. ......... | 340/870.18 |
| 4,989,001 A | * | 1/1991 | Serev .......................... | 341/116 |
| 5,162,798 A | * | 11/1992 | Yundt .......................... | 341/116 |
| 5,241,268 A | * | 8/1993 | Lee ......................... | 324/207.25 |
| 5,347,277 A | * | 9/1994 | Nondahl et al. ............. | 341/116 |
| 5,349,676 A | * | 9/1994 | Garverick et al. ............ | 712/36 |
| 5,455,498 A | * | 10/1995 | Kakimoto et al. .......... | 318/605 |
| 5,684,719 A | * | 11/1997 | Anagnost .................... | 702/153 |
| 5,760,562 A | * | 6/1998 | Woodland et al. .......... | 318/632 |
| 5,783,925 A | * | 7/1998 | Umemura et al. .......... | 318/661 |
| 6,041,336 A | * | 3/2000 | Steinlechner .................. | 708/4 |
| 6,255,794 B1 | * | 7/2001 | Staebler ..................... | 318/605 |
| 6,323,790 B1 | * | 11/2001 | Takehara .................... | 341/111 |
| 6,389,373 B1 | * | 5/2002 | Ohya .......................... | 702/189 |

\* cited by examiner

*Primary Examiner*—John Barlow
*Assistant Examiner*—Demetrius Pretlow
(74) *Attorney, Agent, or Firm*—William J. Benman; Thomas J. Finn; Philip Berestecki (57) ABSTRACT

An apparatus and method for determining the angular position of a rotor. The rotor is a part of a resolver used to determine the position of a shaft, or the like, in operation in a system such as a shaft in a missile gimbal. A digital signal processor is used advantageously to reduce cost. The inherently poorer performance of a data sampling approach in the presence of noise, as compared to the prior art tracking converter approach, is overcome by novel application of the digital signal processor and related circuitry.

23 Claims, 2 Drawing Sheets

DIGITAL SIGNAL PROCESSING OF RESOLVER ROTOR ANGLE SIGNALS

BACKGROUND OF THE INVENTION

1. Field of the Invention

The present invention relates to systems and methods for determining the angular position of a rotor. More specifically, the present invention relates to systems and methods for digital signal processing of gimbal shaft resolver rotor angle signals in real-time control systems.

2. Description of the Related Art

A resolver is a device used to sense the angular position of a rotatable member, such as a shaft. In the prior art, resolvers were used with a tracking converter circuit to monitor the angular position of rotor shafts in real time control systems. For example, such circuits were used to sense the shaft angle of pitch and yaw gimbal in guided missile systems.

A resolver typically includes a rotor which has an electric coil winding that is excited by a sinusoidal oscillating reference voltage. The resolver also includes two stator electric coil windings which are positioned orthogonal with respect to one another. Because of the proximal and orthogonal relationship of stator winding with rotor winding the two stator windings are excited by electromagnetic coupling from the rotor winding and produce output signals which include components of the reference oscillator signal and the sine and cosine of the angle of rotation. Therefore, one winding is called the 'sin' winding and the other is called the 'cos' winding. When the rotor winding is aligned with the cos winding, then the gimbal angle is zero.

The analog output signals from stator windings are applied to the reference inputs of a pair of digital to analog converters. A digital input to the digital to analog converters comes from and up-down counter which represents a trial angle used in tracking the actual rotor angle. Thus, the analog outputs of the two digital to analog converters include components of the reference oscillator, the sine and cosine of the rotor angle, and the cosine and sine of the trial angle, respectively.

The analog output signals of the digital to analog converters are fed into the normal and inverted inputs of an error amplifier and are thus subtracted to create an error signal which is output and contains components of the reference oscillator signal and the sine of the difference between the rotor angle and the trial angle. The error signal is further demodulated by a phase sensitive detector which outputs a direct current error signal that is proportional to just the sine of the difference between the rotor angle and trial angle.

The error signal is subsequently fed to a frequency shaping integrator whose output drives the input of a voltage controlled oscillator which in turn is applied to, the input of the up-down counter. As noted before, the UP-DOWN counter output drives the digital to analog converters such that the error signal is driven to zero due to the feedback loop design of this tracking converter circuit. The rotor, or gimbal, angle G is represented in binary form as the count of up-down counter when the difference between trial angle P and gimbal angle G are driven to zero. Therefore, the rotor angle is output in digital form from UP-DOWN counter which is used by subsequent circuitry in a typical control system.

In a typical application, such as a missile guidance system, the reference oscillator will be in the frequency range of 1 kHz to 10 kHz and the rotor angle will represent that gimbal shaft position, and will be sampled by reading the output of the up-down counter in the range of 1000 to 10,000 times per second, or approximately once for every cycle of the reference voltage. Tracking converters are well understood and have good performance in that the rotor shaft angle can be reliably read as frequently as once per cycle of the reference oscillator as long as the tracking converter error is nulled.

In a real world environment, the tracking converter will be subjected to noise of various kinds. In the example of a missile guidance system, electromagnetic noise is generated within the missile from other internal systems which may include motors and power supplier, or may come from sources outside the missile. As the accuracy of the rotor angle sensing is critical to guidance, in that the rotor represents the angle of the yaw and pitch gimbal for example, which are fed to navigation and guidance systems for the missile, it is essential that the rotor angle be accurately measured. This requires a design with good noise immunity because if noise exceeds the system immunity of the tracking converter, the rotor angle, or gimbal position, fed to other systems will not be accurate leading to improper navigation and guidance of the missile.

The prior art tracking converters offer good noise immunity because the system doubly integrates the signal. First, it is integrated in the frequency shaping integrator and then by up-down counter. This effectively averages the wave form over many periods of the reference voltage wave form. Since inductively coupled noise spikes typically have equal positive and negative going wave forms, such noise is well suppressed through integration. Noise immunity is also augmented by rejection of frequencies beyond the reference frequency by the phase detector, which is a narrow band device that inherently suppresses wide band noise.

The conventional tracking converter, while effective and reliable at tracking a resolver rotor angle, such as a gimbal shaft angle in a guided missile, is problematic because of cost. The digital to analog converters must be high performance devices and are often available only from a single source because of their highly specialized nature. In addition, there are many components needed for the other circuit devices. In most applications of rotor angle position sensing technology, it is necessary to sense a plurality of rotor angle positions simultaneously, so multiple resolvers are required. For example, in a guided missile, there would be both a yaw and pitch gimbal shafts to sense. This would then require a separate instance of the aforementioned tracking converter circuit for each gimbal axis utilized in the missile, which multiplies the cost factor.

Thus there is a need in the art for a tracking circuit design that reduces component cost, allows for measuring more than one resolver rotor angle, and provides adequate noise immunity, measuring accuracy, and performance to equal or exceed, the prior art tracking converters.

SUMMARY OF THE INVENTION

The need in the art is addressed by the apparatus and methods of the present invention. The illustrative embodiments of the inventive apparatus are circuits in which a resolver is coupled in circuit to a digital signal processor that samples the resolver stator winding signals and calculates the rotor angle. The present invention applies digital signaling processing to the sampled signals in order to determine the rotor angle. However, since digital signaling processing is inherently a sampling process, it is sensitive to noise. In addition to the aforementioned cost savings, the digital signaling techniques of the present invention advantageously improve the computation of the angle in the presence of noise. In a first illustrative embodiment, an over sampling technique is employed. In a second illustrative embodiment, a fast Fourier transform technique is employed. In a third illustrative embodiment a sigma-delta converter is employed in conjunction with the digital signal processor.

In the first illustrative embodiment, the apparatus for measuring angular position of a resolver rotor includes a resolver which has a rotor with a winding excited by a periodic wave reference voltage. The resolver also has a first stator winding, excited by energy coupled from the rotor winding, and a second stator winding, also excited by energy coupled from the rotor winding. The two stator windings are oriented orthogonal with respect to each other. The apparatus includes a first and second low pass filter with corner frequencies substantially higher than the frequency of the periodic wave reference voltage. The stator windings are coupled through the low pass filters. The apparatus also has a multiplexer with a first, second, and perhaps more, inputs coupled to the outputs of the two low pass filters. The multiplexer has a control input for selecting one of its inputs to be coupled to an output of the multiplexer. An analog to digital converter receives the output of the multiplexer and converts the analog resolver stator winding signals to digital signals. The digital signals are coupled to a digital signal processor. The digital signal processor also has a control output coupled to the control input of the multiplexer for selecting which one of the multiplexer inputs is coupled through at any given time. The digital signal processor repeatedly samples the output of the analog to digital converter and accumulates a plurality of data points representative of the output voltage present on the stator windings. The digital signal processor also calculates the rotor angle by averaging several representative numeric values derived from the plurality of data points.

In a second illustrative embodiment, the apparatus for measuring angular position of a resolver rotor includes a resolver which has a rotor with a winding excited by a periodic wave reference voltage. The resolver also has a first stator winding, excited by energy coupled from the rotor winding, and a second stator winding, also excited by energy coupled from the rotor winding. The two stator windings are oriented orthogonal with respect to each other. The apparatus includes a first and second low pass filter with corner frequencies substantially higher than the frequency of the periodic wave reference voltage. The stator windings are coupled through the low pass filters. The apparatus also has a multiplexer with a first, second, and perhaps more, inputs coupled to the outputs of the two low pass filters. The multiplexer has a control input for selecting one of its inputs to be coupled to an output of the multiplexer. An analog to digital converter receives the output of the multiplexer and converts the analog resolver stator winding signals to digital signals. The digital signals are coupled to a digital signal processor. The digital signal processor also has a control output coupled to the control input of the multiplexer for selecting which one of the multiplexer inputs is coupled through at any given time. The digital signal processor samples the output of the analog to digital converter and accumulates a plurality of data points representative of the output voltage present on the stator windings. The digital signal processor calculates a series of spectral coefficients using a fast Fourier transform algorithm applied to the plurality of data points thereby isolating the majority of noise energy from the desired signal energy by selecting a group of pertinent Fourier coefficients, and subsequently calculates the rotor angle using the pertinent Fourier coefficients.

In a third illustrative embodiment, the apparatus for measuring angular position of a resolver rotor includes a resolver which has a rotor with a winding excited by a periodic wave reference voltage. The resolver also has a first stator winding, excited by energy coupled from the rotor winding, and a second stator winding, also excited by energy coupled from the rotor winding. The two stator windings are oriented orthogonal with respect to each other. The apparatus includes a first and second low pass filter with corner frequencies substantially higher than the frequency of the periodic wave reference voltage. The stator windings are coupled through the low pass filters. Two sigma-delta converters are coupled to the outputs of the low pass filters, in place of the analog to digital converters used in the previous embodiment. A digital signal processor is coupled to the outputs of the sigma-delta converters. The digital signal processor samples said outputs of the sigma-delta converters and accumulates a plurality of data points representative of the output voltage present on the outputs of the stator windings. The digital signal processor calculates the rotor angle by averaging a plurality of resultant values derived from the plurality of data points.

DESCRIPTION OF THE INVENTION

Illustrative embodiments and exemplary applications will now be described with reference to the accompanying drawings to disclose the advantageous teachings of the present invention. While the present invention is described herein with reference to illustrative embodiments for particular applications, it should be understood that the invention is not limited-thereto. Those having ordinary skill in the art and access to the teachings provided herein will recognize additional modifications, applications, and embodiments within the scope thereof and additional fields in which the present invention would be of significant utility.

Figure 1:
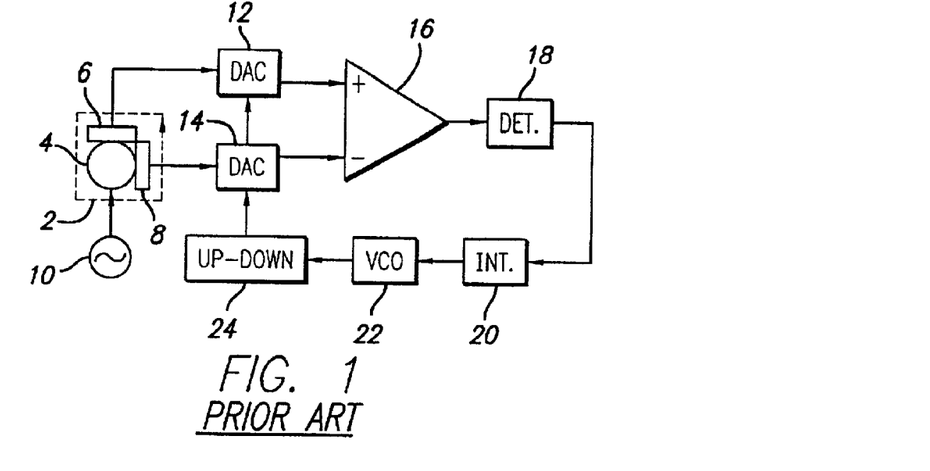
FIG. 1 depicts the prior art tracking converter resolver rotor angle measuring circuit.

Reference is directed to FIG. 1 which depicts the prior art resolver and tracking converter circuit. The resolver 2 includes a rotor 4 which has an electric coil winding that is excited by an oscillator 10 that supplies a sinusoidal oscillating reference voltage generally described by:

$$v \sin(t)$$

The resolver 2 also includes two stator electric coil windings 6 and 8 (that may be referred to as 'windings' hereinafter) which are positioned orthogonal with respect to one another. Because of the proximal and orthogonal relationship of stator winding 6 and 8 with rotor winding 4, the two stator windings are excited by electromagnetic coupling from the rotor winding and produce output signals which can be mathematically described as:

First winding–v sin(t)sin(G)

and

Second winding–v sin(t)cos(G)

where 'G' is the rotor angle of interest.

The first winding is the 'sin' winding and the second winding is the 'cos' winding. When the rotor winding is aligned with the cos winding, then the gimbal angle is zero.

The analog output signals from stator windings 6 and 8 are applied to the reference inputs of digital to analog converters 12 and 14. The digital input from UP-DOWN counter 24 (discussed hereinafter) is a representation of trial angle P. The coefficients of digital to analog converters 12 and 14 are selected to yield the sine and cosine functions respectively. Thus, the analog outputs of digital to analog converters 12 and 14 are mathematically described as:

DAC 12–v sin(t)sin(G)cos(P)

and

DAC 14–v sin(t)cos(G)sin(P)

The analog output signals of digital to analog converters 12 and 14 are fed into the normal and inverted inputs of error amplifier 16 and are thus subtracted to create an error signal which is output from error amplifier 16, and can be described as:

v sin(t) [sin(G)cos(P)–cos(G) sin(P)]

which is mathematically reduced to:

v sin(t)sin(G–P)

The error signal is further demodulated by phase sensitive detector 18 which outputs a direct current error signal that is proportional to:

Error Signal: ~sin(G–P)

The error signal is subsequently fed to frequency shaping integrator 20 whose output drives the input of voltage controlled oscillator 22 which in turn is applied to the input of up-down counter 24. As noted before, the UP-DOWN counter 24 output drives the digital to analog converters 12 and 14 such that the error signal is driven to zero due to the feedback loop design of this tracking converter circuit. The rotor, or gimbal, angle G is represented in binary form as the count of up-down counter 24 when the difference between trial angle P and gimbal angle G are driven to zero. Therefore, the rotor angle is output in digital form from UP-DOWN counter 24.

In a typical application, such as a missile guidance system, v sin(t) will be in the frequency range of 1 kHz to 10 kHz and the rotor angle will represent that gimbal shaft position, and will be sampled by reading the output of UP-DOWN counter 24 in the range of 1000 to 10,000 times per second, or approximately once for every cycle of the reference voltage, v sin(t). Tracking converters are well understood and have good performance in that the rotor shaft angle can be reliably read as frequently as once per cycle of the reference oscillator as long as the tracking converter error is nulled.

Figure 2:
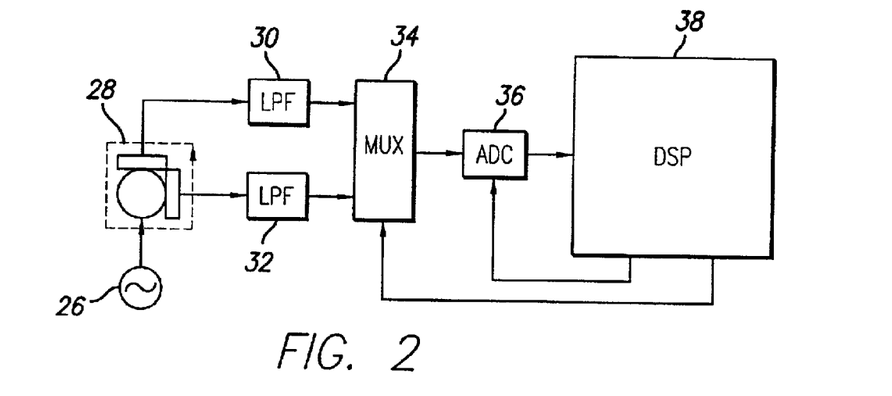
FIG. 2 is a functional block diagram of an illustrative embodiment of the over sampling digital signal processor of the present invention.

With respect to the present invention, reference is directed to FIG. 2 which is a functional block diagram of the first illustrative embodiment, which employs an over-sampling technique in application of a digital signaling processor to resolver rotor angle measurement.

The resolver 28 is generally the same device as was described in the prior art in that it comprises a rotor that has a winding that is excited by sinusoidal reference voltage supplied by oscillator 26. As in the prior art, the reference voltage is described by the equation v sin(t). The resolver also comprises two stator windings (the cos winding and sin winding), as in the prior art which output signals described by the equations:

sin winding–v sin(t)sin(G)

and cos winding–v sin(t)cos(G)

where 'G' is the rotor angle of interest.

The sin and cos winding signals are sinusoidal signals that are generated in the presence of noise so they are better described by the previous equations, plus the addition of noise. As was discussed earlier, suppression of noise is a crucial consideration in system performance as this will greatly enhance rotor angle measurement accuracy, which translates into greatly enhanced system performance.

In this illustrative embodiment, noise is first suppressed by low pass filters 30 and 32. Since the energy of interest in measuring the rotor angle is centered around the frequency of the reference oscillator (v sin(t)), the half power frequency (or merely the 'corner' frequency) of low pass filters 30 and 32 are set to pass energy at the reference frequency and lower. However, because the accurate calculation of rotor angle requires a signal with little or no phase distortion, the filter design and filter corner frequencies of low pass filters 30 and 32 are selected so that phase linearity of the filters is very flat. It is noted that a first order low pass filter with a corner frequency equal to at least ten times the reference oscillator frequency will yield acceptable phase response, while suppressing noise ten or more times the reference oscillator frequency.

One of the advantages of the present invention is that multiple windings and multiple rotor angles can be measured with a single circuit. While this will discussed more fully hereinafter, it should be noted that the multiplexer 34 shown in FIG. 2 offers the benefit of multiplexing not only the two winding signals of the single resolver of this embodiment, but could also multiplex several other winding signals from other resolvers.

Referring to FIG. 2 again, multiplexer 34 is an analog multiplexer with a control signal input that controls which one of the inputs to multiplexer 34 is coupled to the output. In this embodiment, the digital signal processor 38 provides the control signal. Over the course of time, each of sin and cos winding signals are coupled through multiplexer 34 alternating in time. It should be understood that analog multiplexer devices are well understood by those skilled in the art.

The output of multiplexer 34 is coupled to the input of analog to digital converter 36. Analog to digital converter 36 is of conventional design such that the output of analog to digital converter is a digital representation of the instantaneous analog voltage at its input. For the applications envisioned by the inventors, analog to digital converters with bit depths of 8-bits, 12-bits, and 16-bits are applicable, however, it is understood that other applications may required converters with lower or higher bit resolutions depending on the requirements of sped and accuracy of the rotor angle measurement.

The digital output of the analog to digital converter 26 is fed to a digital input of digital signal processor 38. The coupling of this data may be by serial, parallel or other suitable interface. Digital signal processor 38 has a control output which is coupled back to the control input of multiplexer 3. This connection allows digital signal processor 38 to select which of the sin and cos winding signals is to be converted to digital by analog to digital converter 36 and subsequently sampled by digital signal processor 38 over time.

All other functions of this embodiment are under software control of digital signal processor 38.

The foregoing circuit design allows the digital signal processor to be programmed to sample the sin and cos winding sinusoidal wave forms to determine their respective frequency, amplitude and phase such that the calculations as used in the prior art can be completed to reduce this data and to determine the rotor angle. However, such a digital signaling process is inherently a sampling process, it is not inherently immune to noise. It is necessary to process the signals in such a way as to reduce the effects of random noise on the accuracy of the rotor angle measurement.

Noise occurs as a random event which distorts the winding signals. As was noted earlier, noise in a system such as this will typically be inductively coupled and will therefore typically comprise equal and opposite positive and negative going spikes on the otherwise smooth sinusoidal wave form. As the signal is sampled, there is a probability that the instantaneous voltage measurement will occur during the interval of one half of a noise spike and not the other. Without some form of noise immunity, this effect will reduce the accuracy of the wave form measurement and therefore reduce the accuracy of the rotor angle measurement.

The technique employed in this illustrative embodiment is to over-sample the waveform and average the measurements to suppress the effects of noise. In the example of a missile guidance system, the rotor angle may be measured at about one thousand times per second. The reference oscillator frequency will be selected to be about one kilohertz. A suitable over-sampling rate is one million samples per second which amounts to an over-sampling rate of about 500 times. Since the digital signal processor 38 has an extremely high processing rate (currently sixty million instructions per second is achievable with an economical price/performance point), the digital signal processor can make 500 separate calculations of the input waveform to produce 500 resultant output values of the wave form waveform parameters. Each affected by the noise present in the system.

Each of the resultant output values are used to calculate the rotor angle. Each of the angle calculations produces an angle result plus noise. That is, in accordance with the present teachings the rotor angle is calculated repeatedly using a unique subset of data points for each calculation, thereby creating a plurality of rotor angle results. However, when the calculations are summed, the angle results add linearly while the random noise summed as the root of the sum of the squares. Thus, when the sum is divided by the number of calculations, the angle is obtained with the noise divided by the square root of the number of samples. With a digital signal processor capable of sixty million instructions per second and an angle update rate of one kilohertz, the noise improvement factor is approximately 30 dB. A 30 dB noise suppression factor at least equals the noise performance of the prior art tracking converter. And, the cost of the digital signal processor based design is substantially lower than the prior art tracking converter of comparable performance. In addition, the digital signal processor based design can easily track two or more rotors where as the prior art tracking converter can only track one rotor.

Figure 3:
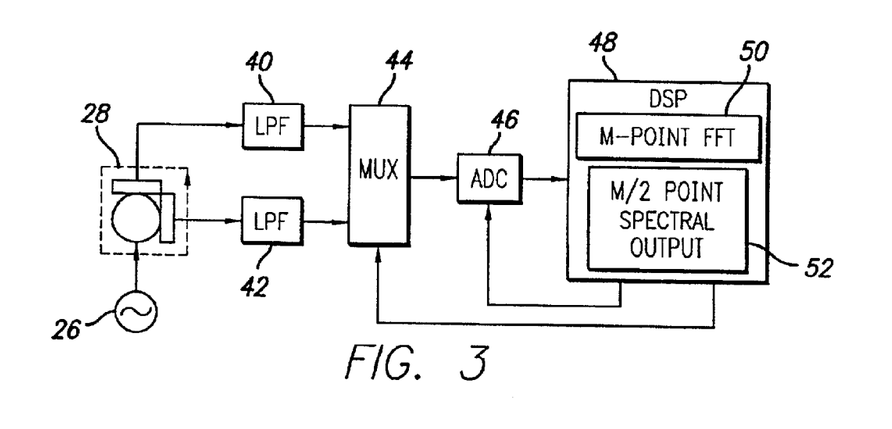
FIG. 3 is a functional block diagram of an illustrative embodiment of the present invention using a fast Fourier transform.

Reference is directed to FIG. 3 which is a functional block diagram of the fast Fourier transform illustrative embodiment. In this figure, the resolver 28, reference oscillator 26, low pass filters 40 and 42, the multiplexer 46, the analog to digital converter 46, and the hardware aspects of digital signal processor 48 correspond directly to those in the first illustrative embodiment shown in FIG. 2. Therefore, for a discussion of these components in this FIG. 3, please see the discussion pertinent to FIG. 2 which is directly applicable to this FIG. 3.

Where the present illustrative embodiment shown in FIG. 3 differs from that shown in FIG. 2 is in the approach used to enhance noise immunity of the system. In the illustrative embodiment of FIG. 3, a fast Fourier transform algorithm is use advantageously. In effect, the fast Fourier transform is used like a narrow band filter to isolate the actual rotor angle data (the signal) from the noise before calculating the rotor angle output. This technique effectively suppresses out of band noise and improves the overall noise immunity of the system.

The noise spectrum is spread over the range from zero to one-half the sampling frequency. In the examples used herein, that would be zero to five hundred kilohertz for a one million sample per second sampling rate. In a fast Fourier transform with M points, this band of frequencies will be divided into M divided by two components. For the example used herein, with a sampling rate of one million samples per second yielding an over sampling rate of approximately 500 angle calculations as inputs to the M-point fast Fourier transform algorithm, identified as block 50 in FIG. 3, the noise will be divided into five hundred divided by two, or two hundred-fifty compartments, identified as block 52 in FIG. 3. If the sampling rate and reference frequency are selected appropriately, the signal will fall within a single compartment. Therefore, the noise improvement factor will equal the square root of M divided by two. This yields a noise improvement factor of about 24 dB. Another advantage of this approach is a reduction in the number of calculations needed to complete the fast Fourier transform. While the number of data signal points ('M') input to the fast Fourier transform must correspond to system design requirements, the Fourier coefficients output can be reduced to a few, or as few as one. Since the spectral band of interest is known and highly confined to that band around the reference oscillator frequency, only a few of the Fourier coefficients need be calculated. Therefore, the calculations for all of the unneeded Fourier coefficients can be eliminated, greatly reducing processor overhead.

Figure 4:
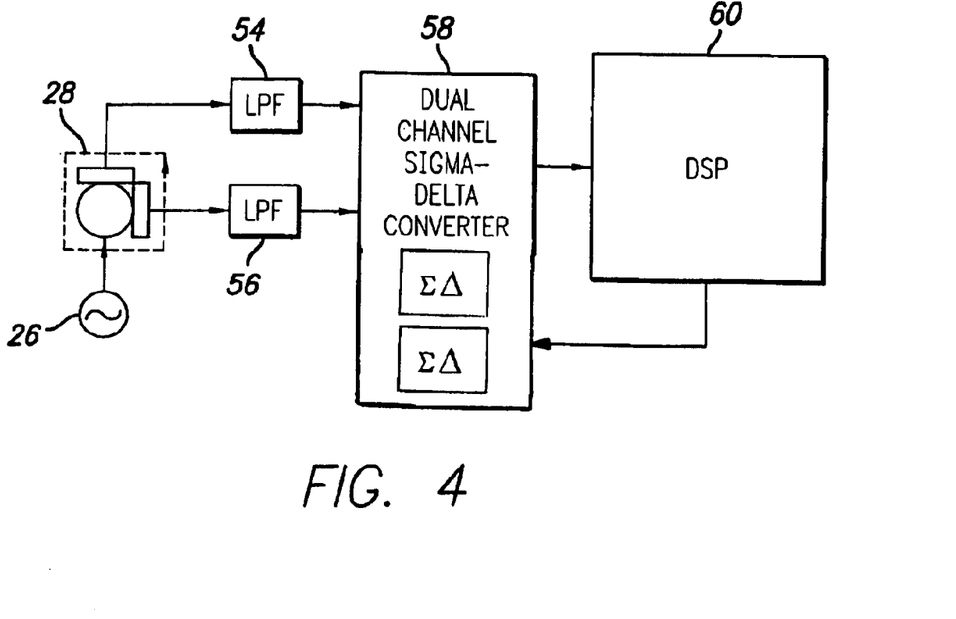
FIG. 4 is a functional block diagram of an illustrative embodiment of the sigma-delta converter of the present invention.

Reference is directed to FIG. 4, which is a functional block diagram of the third illustrative embodiment of the present invention. In this embodiment, sigma-delta converters are used to over sample the input signals form the sin and cos windings and has the effect of noise shaping and reduction. In this figure, the resolver 28, reference oscillator 26, low pass filters 54 and 56, and the hardware aspects of digital signal processor 60 correspond directly to those in the first illustrative embodiment shown in FIG. 2. Therefore, for a discussion of these components in this FIG. 4, please see the discussion pertinent to FIG. 2 which is directly applicable to this FIG. 4, for the aforementioned elements.

In the illustrative embodiment of FIG. 4, the multiplexer and analog to digital converters of the prior embodiments have been replaced with sigma-delta converters. In this particular embodiment, it is a dual channel sigma-delta converter 58. A dual channel converter is simply a device that includes two single channel converters and that realizes certain packaging economies. The sigma-delta converter provides the advantage of over sampling and the feature of noise shaping within the frequency band of interest, which is that band around the reference frequency of the resolver rotor.

The sigma-delta conversion technique is known to those skilled in the art. The noise shaping filter, or integrator, of a sigma-delta converter distributes the converter quantization error, or noise, such that it is very low in the band of interest. The inherent over sampling characteristic of the sigma-delta converter provides that same noise immunity that was discussed respecting the over sampling technique of the first illustrative embodiment. However, a sigma-delta converter of the first order requires only a single bit digital to analog converter so its cost is held correspondingly low when compared to the conventional tracking converter which requires a digital to analog converter in the twelve to sixteen bit range for the exemplary applications discussed herein. Second and third order sigma-delta converters would require a 2-bit and 3-bit converter respectively.

In a sigma-delta converter, the higher the order, the higher the noise shaping and the lower the noise generated at the output. For example, it is understood that with a 48 kHz sigma-delta converter output rate, noise improvement factors of 28 dB, 45 dB, and 62 dB are possible from first, second, and third order sigma-delta converters respectively. Modern sigma-delta converters can be run fast enough to allow a running average to be performed. This gives the added benefit of the over sampling noise reduction discussed herein before. This improvement would add to the improvements already provided by the sigma-delta converter method.

Figure 5:
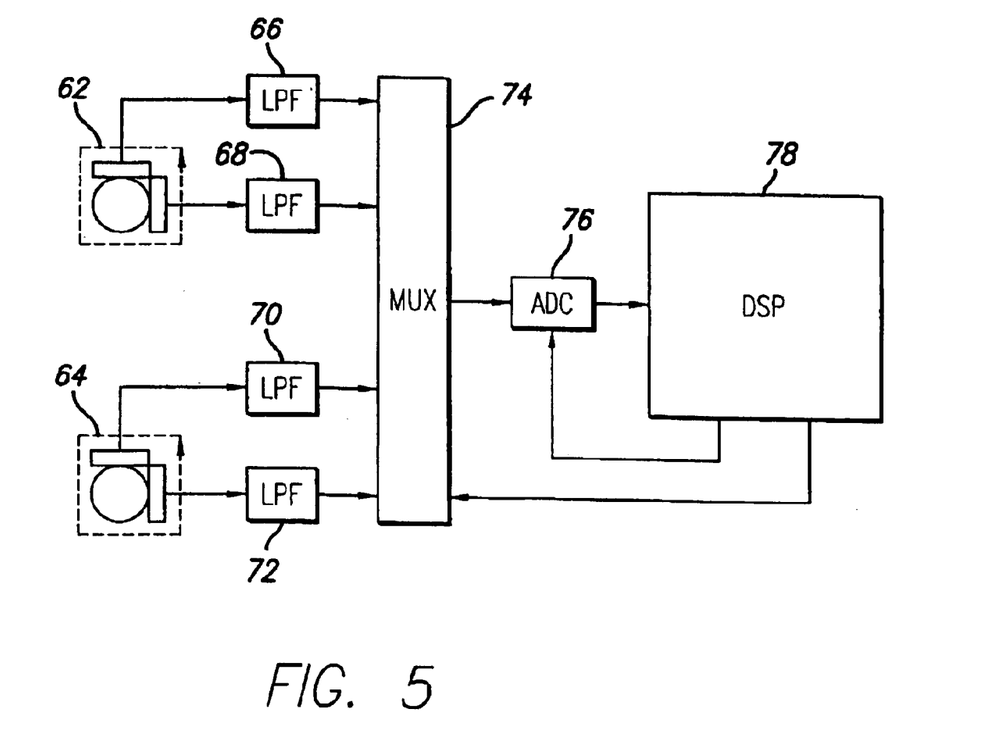
FIG. 5 is a functional block diagram of a multiple rotor implementation of the present invention.

Reference is directed to FIG. 5 which is a functional block diagram of a multiple rotor implementation of the present invention. In the three illustrative embodiments of the present invention, the number of rotors for which angular position information was calculated was limited to one for the purpose of simplicity in describing the present invention. However, as was briefly mentioned before, one important advantage of the present invention is the substantial cost savings that can be realized through the reduction in parts cost.

In FIG. 5, two resolvers 62 and 64 are coupled to four low pass filters 66, 68, 70, and 72. One is required for each winding in each resolver 62 and 64. The outputs of the low pass filters are coupled to a four-input multiplexer 74. The output of the multiplexer 74 is coupled to a single analog to digital converter 76 which converts that sampled analog signal information into digital signals and supplies it to digital signal processor 78. While this implementation shows how two resolvers can be accommodated by a single analog to digital converter and digital signal processor, those skilled in the art will appreciate that the number of resolvers that can be accommodated will be limited by the performance criteria specified for the system, such as the sampling rate and angular update rate, and the performance of available analog to digital converters and digital signal processors. In effect, the savings achievable by this technique are limited only be current technology and system design parameters.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. An apparatus for measuring angular position of a rotor, comprising:
   a resolver having a rotor, and having a first output for outputting a first signal representative of the sine of the rotor angle and a second output for outputting a second signal representative of the cosine of the rotor angle;
   an analog to digital converter having an input coupled to said first and second outputs of said resolver, and having a output;
   a digital signal processor having an input coupled to said output of said analog to digital converter, and wherein said digital signal processor repeatedly samples said output of said analog to digital converter and accumulates a plurality of data points representative of the output signal present on said first and second outputs of said resolver, and wherein
      said digital signal processor calculates the rotor angle by averaging a plurality of resultant values derived from said plurality of data points.

2. The invention of claim 1 further comprising:
   a first low pass filter disposed to couple said first output of said resolver to said input of said analog to digital converter, and
   a second low pass filter disposed to couple said second output of said resolver to said input of said analog to digital converter.

3. The invention of claim 2 wherein said resolver rotor is excited by a reference sinusoidal voltage, and wherein said first and second low pass filters are first order low pass filters having a half power point at a frequency at least ten times the frequency of said reference sinusoidal voltage.

4. The invention of claim 1 further comprising:
   a multiplexer having at least a first and second input and an output, and having a control input operable to select which one of said inputs is coupled to said output, said multiplexer disposed between said resolver and said analog to digital converter such that said first and second outputs of said resolver are coupled to said first and second inputs of said multiplexer, and said output of said multiplexer is coupled to said input of said analog to digital converter, and wherein
      said digital signal processor has a control output coupled to said control input of said multiplexer.

5. An apparatus for measuring angular position of a rotor, comprising:
   a resolver, further comprising;
      a rotor having a winding excited by a periodic wave reference voltage;
      a first stator winding, excited by energy coupled from said rotor winding, and having an output;
      a second stator winding, excited by energy coupled from said rotor winding, having an output, and oriented orthogonal with respect to said first stator winding;
   a first low pass filter, with a corner frequency substantially higher than the frequency of said periodic wave reference voltage, having an input coupled to said output of said first stator winding, and having an output;

a second low pass filter, with a corner frequency substantially higher than the frequency of said periodic wave reference voltage, having an input coupled to said output of said second stator winding, and having an output;

a multiplexer having at least a first and second input coupled to said outputs of said first and second low pass filters, and having an output, and having a control input for selecting one of said at least first and second inputs to be coupled to said output;

an analog to digital converter having an input coupled to said output of said multiplexer, and having a output;

a digital signal processor having an input coupled to said output of said analog to digital converter, and having a control output coupled to said control input of said multiplexer for selecting one of said at least first and second inputs of said multiplexer to be coupled to said output of said multiplexer, and wherein said digital signal processor repeatedly samples said output of said analog to digital converter and accumulates a plurality of data points representative of the output voltage present on said outputs of said first and second stator windings, and wherein said digital signal processor calculates the rotor angle by averaging a plurality of resultant values derived from said plurality of data points.

6. A method of producing a rotor angle output signal in a system having a resolver with a rotor and a first stator winding outputting a sinusoidal signal representative of the sine of the rotor angle and a second stator winding outputting a sinusoidal signal representative of the cosine of the rotor angle, the system having an analog to digital converter coupled to receive the analog stator winding signals and converting them to digital signals and coupling the digital signals to a digital signal processor, comprising the steps of:

repeatedly sampling, by the digital signal processor, the first and second stator winding signals by reading the output of the analog to digital converter;

accumulating a plurality of data points, by the digital signal processor, corresponding to the analog stator winding signals over time;

repeatedly calculating the rotor angle using a unique subset of said plurality of data points for each calculation, thereby creating a plurality of rotor angle results, and calculating the average of said plurality of rotor angle results to produce a rotor angle output signal.

7. The invention of claim 6 further comprising the step of filtering the first and second stator winding sinusoidal signals through a first order low pass filter having a half-power frequency at least ten times the frequency of the sinusoidal signals.

8. An apparatus for measuring angular position of a rotor, comprising:

a resolver having a rotor, and having a first output for outputting a first signal representative of the sine of the rotor angle and a second output for outputting a second signal representative of the cosine of the rotor angle;

an analog to digital converter having an input coupled to said first and second outputs of said resolver, and having a output;

a digital signal processor having an input coupled to said output of said analog to digital converter, and wherein said digital signal processor samples said output of said analog to digital converter and accumulates a plurality of data points representative of the voltages present on said first and second outputs of said resolver, and wherein said digital signal processor calculates a series of spectral coefficients with a fast Fourier transform applied to said plurality of data points thereby isolating the majority of noise energy from the desired signal energy by selecting a group of pertinent Fourier coefficients, and subsequently calculates the rotor angle using said pertinent Fourier coefficients.

9. The invention of claim 8 further comprising:

a first low pass filter disposed to couple said first output of said resolver to said input of said analog to digital converter, and a second low pass filter disposed to couple said second output of said resolver to said input of said analog to digital converter.

10. The invention of claim 9 wherein said resolver rotor is excited by a reference sinusoidal voltage, and wherein said first and second low pass filters are first order low pass filters having a half power point at a frequency at least ten times the frequency of said reference sinusoidal voltage.

11. The invention of claim 8 further comprising:

a multiplexer having at least a first and second input and an output, and having a control input operable to select which one of said inputs is coupled to said output, said multiplexer disposed between said resolver and said analog to digital converter such that said first and second outputs of said resolver are coupled to said first and second inputs of said multiplexer, and said output of said multiplexer is coupled to said input of said analog to digital converter, and wherein said digital signal processor has a control output coupled to said control input of said multiplexer.

12. An apparatus for measuring angular position of a rotor, comprising:

a resolver, further comprising;

a rotor having a winding excited by a periodic wave reference voltage;

a first stator winding, excited by energy coupled from said rotor winding, and having an output;

a second stator winding, excited by energy coupled from said rotor winding, having an output, and oriented orthogonal with respect to said first stator winding;

a first low pass filter, with a corner frequency substantially higher than the frequency of said periodic wave reference voltage, having an input coupled to said output of said first stator winding, and having an output;

a second low pass filter, with a corner frequency substantially higher that the frequency of said periodic wave reference voltage, having an input coupled to said output of said second stator winding, and having an output;

a multiplexer having a least a first and second input coupled to said outputs of said first and second low pass filters, and having an output, and having a control input for selecting one of said at least first and second inputs to be coupled to said output;

an analog to digital converter having an input coupled to said output of said multiplexer, and having a output;

a digital signal processor having an input coupled to said output of said analog to digital converter, and having a control output coupled to said control input of said multiplexer for selecting one of said at least first and second inputs of said multiplexer to be coupled to said output of said multiplexer, and wherein said digital signal processor samples said output of said analog to digital converter and accumulates a plurality of data points representative of the output voltage present on said outputs of said first and second stator windings, and wherein said digital signal processor calculates a series of spectral coefficients with a fast Fourier transform applied to said plurality of data points thereby isolating the majority of noise energy from the desired signal energy by selecting a group of pertinent Fourier coefficients, and subsequently calculates the rotor angle using said pertinent Fourier coefficients.

13. A method of producing a rotor angle output signal in a system having a resolver with a rotor and a first stator winding outputting a sinusoidal signal representative of the sine of the rotor angle and a second stator winding outputting a sinusoidal signal representative of the cosine of the rotor angle, the system having an analog to digital converter coupled to receive the analog stator winding signals and converting them to digital signals and coupling the digital signals to a digital signal processor, comprising the steps of:

repeatedly sampling, by the digital signal processor, the first and second stator winding signals by reading the output of the analog to digital converter;

accumulating a plurality of data points, by the digital signal processor, corresponding to the analog stator winding signals over time;

calculating a series of spectral coefficients using said plurality of data points as input to a fast Fourier transform algorithm;

calculating the rotor angle using the spectral coefficients centered around the frequency of the sinusoidal signal frequencies, and outputting the calculated rotor angle.

14. The invention of claim 13 further comprising the step of filtering the first and second stator winding sinusoidal signals through a first order low pass filter having a half-power frequency at least ten times the frequency of the sinusoidal signals.

15. An apparatus for measuring angular position of a rotor, comprising:

a resolver having a rotor, and having a first output for outputting a first signal representative of the sine of the rotor angle and a second output for outputting a second signal representative of the cosine of the rotor angle;

a sigma-delta converter having an input coupled to said first and second outputs of said resolver, and having an output;

a digital signal processor having an input coupled to said output of said sigma-delta converter, and wherein said digital signal processor samples said output of said sigma-delta converter and accumulates a plurality of data points representative of the output voltage present on said first and second outputs of said resolver, and wherein said digital signal processor calculates the rotor angle by averaging a plurality of resultant values derived from said plurality of data points.

16. The invention of claim 15 further comprising:

a first low pass filter disposed to couple said first output of said resolver to said input of said analog to digital converter, and a second low pass filter disposed to couple said second output of said resolver to said input of said analog to digital converter.

17. The invention of claim 16 wherein said resolver rotor is excited by a reference sinusoidal voltage, and wherein said first and second low pass filters are first order low pass filters having a half power point at a frequency at least ten times the frequency of said reference sinusoidal voltage.

18. The invention of claim 15 further comprising:

a multiplexer having at least a first and second input and an output, and having a control input operable to select which one of said inputs is coupled to said output, said multiplexer disposed between said resolver and said analog to digital converter such that said first and second outputs of said resolver are coupled to said first and second inputs of said multiplexer, and said output of said multiplexer is coupled to said input of said analog to digital converter, and wherein said digital signal processor has a control output coupled to said control input of said multiplexer.

19. An apparatus for measuring angular position of a rotor, comprising:

a resolver, further comprising;

a rotor having a winding excited by a periodic wave reference voltage;

a first stator winding, excited by energy coupled from said rotor winding, and having an output;

a second stator winding, excited by energy coupled from said rotor winding, having an output, and oriented orthogonal with respect to said first stator winding;

a first low pass filter, with a corner frequency substantially higher than the frequency of said periodic wave reference voltage, having an input coupled to said output of said first stator winding, and having an output;

a second low pass filter, with a corner frequency substantially higher that the frequency of said periodic wave reference voltage, having an input coupled to said output of said second stator winding, and having an output;

a first sigma-delta converter having an input coupled to said output of said first low pass filter, and having an output;

a second sigma-delta converter having an input coupled to said output of said second low pass filter, and having an output;

a digital signal processor having a first input coupled to said output of said first sigma-delta converter and a second input coupled to said output of said second sigma-delta converter, and wherein said digital signal processor samples said outputs of said first and second sigma-delta converters and accumulates a plurality of data points representative of the output voltage present on said outputs of said first and second stator windings, and wherein said digital signal processor calculates the rotor angle by averaging a plurality of resultant values derived from said plurality of data points.

20. A method of producing a rotor angle output signal in a system having a resolver with a rotor and a first stator winding outputting a sinusoidal signal representative of the sine of the rotor angle and a second stator winding outputting a sinusoidal signal representative of the cosine of the rotor angle, the system having an sigma-delta converter coupled to receive the analog stator winding signals and converting them to digital signals and coupling the digital signals to a digital signal processor, comprising the steps of:

repeatedly sampling, by the digital signal processor, the first and second stator winding signals by reading the output of the sigma-delta converter;

accumulating a plurality of data points, by the digital signal processor, corresponding to the analog stator winding signals over time;

calculating the rotor angle using said plurality of data points, and outputting the rotor angle.

21. The invention of claim 20 further comprising the step of filtering the first and second stator winding sinusoidal signals through a first order low pass filter having a half-power frequency at least ten times the frequency of the sinusoidal signals.

22. A method of producing a rotor angle output signal in a system having a resolver with a rotor and a first stator winding outputting a sinusoidal signal representative of the sine of the-rotor angle and a second stator winding outputting a sinusoidal signal representative of the cosine of the rotor angle, the system having an sigma-delta converter coupled to receive the analog stator winding signals and converting them to digital signals and coupling the digital signals to a digital signal processor, comprising the steps of:

repeatedly sampling, by the digital signal processor, the first and second stator winding signals by reading the output of the sigma-delta converter;

accumulating a plurality of data points, by the digital signal processor, corresponding to the analog stator winding signals over time;

repeatedly calculating the rotor angle using a unique subset of said plurality of data points for each calculation, thereby creating a plurality of rotor angle results, and calculating the average of said plurality of rotor angle results to produce a rotor angle output signal.

23. The invention of claim 22 further comprising the step of filtering the first and second stator winding sinusoidal signals through a first order low pass filter having a half-power frequency at least ten times the frequency of the sinusoidal signals.

* * * * *